(12) United States Patent
Thuerlemann et al.

(10) Patent No.: US 8,106,564 B2
(45) Date of Patent: Jan. 31, 2012

(54) ULTRASONIC TRANSDUCER

(75) Inventors: Silvan Thuerlemann, Unteraegeri (CH); Martin Von Arx, Unteraegeri (CH)

(73) Assignee: Esec AG, Cham (CH)

( * ) Notice: Subject to any disclaimer, the term of this patent is extended or adjusted under 35 U.S.C. 154(b) by 300 days.

(21) Appl. No.: 12/593,954

(22) PCT Filed: Mar. 20, 2008

(86) PCT No.: PCT/EP2008/053359
§ 371 (c)(1),
(2), (4) Date: Oct. 1, 2009

(87) PCT Pub. No.: WO2008/122499
PCT Pub. Date: Oct. 16, 2008

(65) Prior Publication Data
US 2010/0127599 A1    May 27, 2010

(30) Foreign Application Priority Data
Apr. 4, 2007  (CH) .......................... 583/07

(51) Int. Cl.
*H04R 1/02*  (2006.01)
(52) U.S. Cl. .......... 310/323.19; 310/323.02; 310/323.18
(58) Field of Classification Search ............. 310/323.02, 310/323.18, 323.19
See application file for complete search history.

(56) References Cited

U.S. PATENT DOCUMENTS

| | | |
|---|---|---|
| 4,173,725 A * | 11/1979 | Asai et al. ..................... 310/325 |
| 5,114,302 A | 5/1992 | Meisser et al. |
| 5,180,093 A | 1/1993 | Stansbury et al. |
| 5,305,556 A | 4/1994 | Kopp et al. |
| 5,364,005 A | 11/1994 | Whelan et al. |
| 5,368,216 A | 11/1994 | Sakakura et al. |
| 5,377,894 A | 1/1995 | Mizoguchi et al. |
| 5,469,011 A | 11/1995 | Safabakhsh |
| 5,578,888 A | 11/1996 | Safabakhsh |
| 5,595,328 A | 1/1997 | Safabakhsh et al. |
| 5,603,445 A | 2/1997 | Hill et al. |
| 5,699,953 A * | 12/1997 | Safabakhsh ................ 228/110.1 |
| 6,135,339 A | 10/2000 | Parrini |

(Continued)

FOREIGN PATENT DOCUMENTS

| | | |
|---|---|---|
| DE | 100 28 774 A1 | 9/2001 |
| DE | 101 14 672 A1 | 9/2002 |
| EP | 1 317 990 A1 | 6/2003 |
| JP | 2001-179179 | 7/2001 |
| WO | 2006036669 A1 | 4/2006 |

OTHER PUBLICATIONS

International Preliminary Report on Patentability for International Application No. PCT/EP2008/053359 dated Nov. 10, 2009.
International Search Report for PCT/EP2008/053359.

*Primary Examiner* — Walter Benson
*Assistant Examiner* — Bryan Gordon
(74) *Attorney, Agent, or Firm* — McCormick, Paulding & Huber LLP

(57) ABSTRACT

An ultrasonic transducer comprises an elongate horn, a counterpiece, two piezoelectric drives and a screw. The counterpiece is fastened to the horn by means of the screw and thus clamps the piezoelectric drives, which are arranged on either side of a longitudinal axis of the ultrasonic transducer, between the horn and the counterpiece. The ultrasonic transducer is designed in such a way that the tip of a capillary which is clamped in the horn can oscillate in two different directions.

16 Claims, 2 Drawing Sheets

U.S. PATENT DOCUMENTS

| | | |
|---|---|---|
| 6,460,751 B1 | 10/2002 | Thuerlemann |
| 6,995,498 B2 | 2/2006 | Wallaschek et al. |
| 7,297,238 B2 * | 11/2007 | Nayar et al. ............. 204/157.62 |
| 2005/0284912 A1 * | 12/2005 | Zhai et al. ..................... 228/1.1 |
| 2007/0080193 A1 | 4/2007 | Kakutani et al. |
| 2007/0164636 A1 * | 7/2007 | Imai et al. ................ 310/323.18 |

* cited by examiner

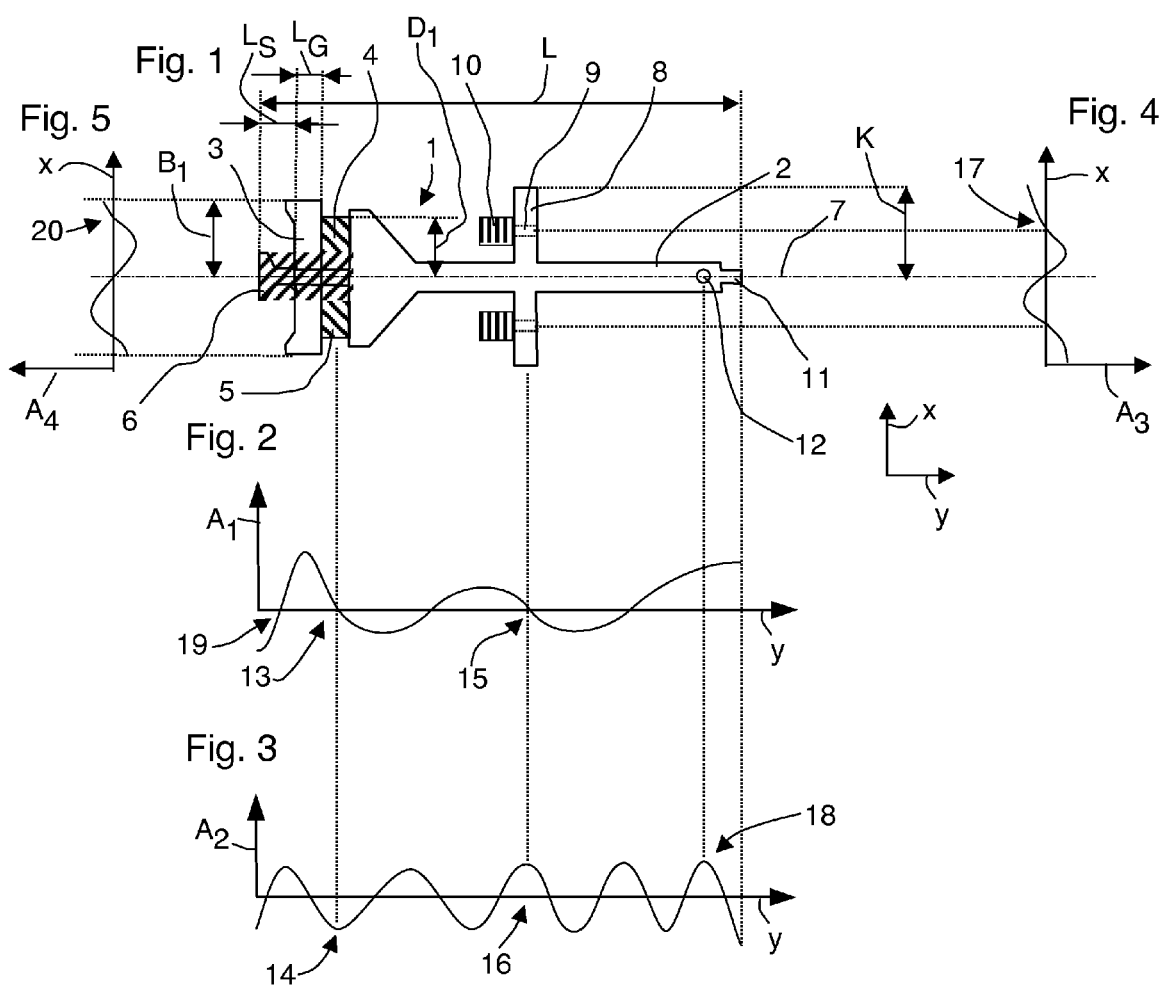

ULTRASONIC TRANSDUCER

CROSS REFERENCE TO RELATED APPLICATIONS

The present application is related to and claims priority based upon PCT patent application no. PCT/EP2008/053359 entitled "Ultrasonic transducer", filed Mar. 20, 2008, which in turn claims priority of the Swiss patent application no. 583/07 filed on Apr. 4, 2007, the disclosures of both of which are herein incorporated by reference.

TECHNICAL FIELD

The invention relates to an ultrasonic transducer.

BACKGROUND OF THE INVENTION

Ultrasonic transducers of this type are used in what are known as ball wire bonders. A wire bonder is a machine which is used to wire semiconductor chips after fitting thereof to a substrate. A ball wire bonder is a wire bonder in which the wire is guided through a longitudinal hole in the capillary and fastened to the connection points by means of the capillary, whereas in the case of what is known as a wedge wire bonder the capillary is replaced by a specific wedge tool which is also known as a sonotrode. The ultrasonic transducer comprises a horn and a piezoelectric drive for exciting an ultrasonic oscillation in the horn. The capillary is clamped to a tip of the horn. During the production of the wired connection between the connection point of the semiconductor chip and the connection point of the substrate, the end of the wire protruding from the capillary is initially melted to form a ball. Subsequently, the wire ball, which is referred to by specialists simply as the ball, is fastened to the connection point of the semiconductor chip by means of pressure and ultrasound. This involves crushing the wire ball. This process is referred to as ball-bonding. The wire is then drawn through to the required wire length, formed into a wire loop and welded to the connection point of the substrate. The latter part of the process is referred to as wedge-bonding. Once the wire has been fastened to the connection point of the substrate, the wire is torn off and the next bonding cycle can begin. In ball-bonding and in wedge-bonding, ultrasound is applied to the horn of the piezoelectric drive.

Ultrasonic transducers are known, for example from U.S. Pat. No. 5,603,445 U.S. Pat. No. 5,595,328, U.S. Pat. No. 5,364,005 U.S. Pat. No. 5,180,093, U.S. Pat. No. 5,368,216, U.S. Pat. No. 5,469,011, U.S. Pat. No. 5,578,888, U.S. Pat. No. 5,699,953 and U.S. Pat. No. 6,135,339.

The known ultrasonic transducers are designed in such a way that a continuous ultrasonic wave, the oscillations of which are directed in the longitudinal direction of the horn, forms in the horn. An ultrasonic wave of this type is also referred to as a longitudinal wave. The bonding head of a ball wire bonder allows the tip of the capillary to move in three spatial directions, whereby the bonding head has only three degrees of freedom. The horn ist therefore oriented, both in a conventional bonding head mounted on an XY table and in a rotative bonding head, such as are known from U.S. Pat. No. 5,114,302, U.S. Pat. No. 6,460,751 and WO 2006036669, more or less along a predetermined direction, whereas the wired connections can extend in all directions. This leads, on the one hand, to the adhesion of the wire to the connection points of the substrate not being of uniform strength in all wired connections and, on the other hand, to variations in the shape of the crushed ball.

SUMMARY OF THE INVENTION

The object of the invention is to achieve improved adhesion of the wire to the connection points of the substrate and a more uniform shape of the crushed ball.

An ultrasonic transducer according to the invention comprises an elongate horn, a counterpiece, two piezoelectric drives and a screw. The counterpiece is fastened to the horn by means of the screw and thus clamps the piezoelectric drives, which are arranged on either side of a longitudinal axis of the ultrasonic transducer, between the horn and the counterpiece. The horn has a flange comprising at least one hole for fastening the ultrasonic transducer to a bonding head of a wire bonder. There form in the transducer first ultrasonic oscillations, which are directed parallel to the longitudinal axis of the transducer, when first, in-phase alternating voltages are applied to the two piezoelectric drives and second ultrasonic oscillations, which are directed transversely to the longitudinal axis of the transducer, when second, inversely phased alternating voltages are applied to the two piezoelectric drives. The ultrasonic transducer is designed in such a way that

- the piezoelectric drives are located in a first node of the first ultrasonic oscillations,
- the piezoelectric drives are located in a first antinode of the second ultrasonic oscillations,
- the flange is located in a second node of the first ultrasonic oscillations,
- the flange is located in a second antinode of the second ultrasonic oscillations, and
- the at least one hole in the flange is located in a further node of the second ultrasonic oscillations.

Two alternating voltages are in-phase if they have the same frequency and the same phase.

Two alternating voltages are inversely phased if they have the same frequency but a different sign so that their phase is delayed by $\pi$.

The horn has a hole for receiving the capillary. This hole is preferably formed in the—measured from the tip of the horn—second antinode of the second ultrasonic oscillations.

Preferably, the second ultrasonic oscillations have at least one node which is located between the head of the screw and the piezoelectric drives.

Preferably, the second ultrasonic oscillations have in the counterpiece a node which is located close to the edge of the counterpiece.

Preferably, a width of the counterpiece is greater than a distance of an outer edge of the piezoelectric drives from the longitudinal axis of the ultrasonic transducer.

The invention will be described hereinafter in greater detail based on an exemplary embodiment and with reference to the drawings. The figures are not true to scale.

BRIEF DESCRIPTION OF THE FIGURES

FIG. 1 is a plan view of an ultrasonic transducer according to the invention, FIG. 2-5 show the amplitude of various ultrasonic oscillations which form in the ultrasonic transducer when an appropriate alternating voltage is applied.

DESCRIPTION OF THE PREFERRED EMBODIMENTS

Figure 6:
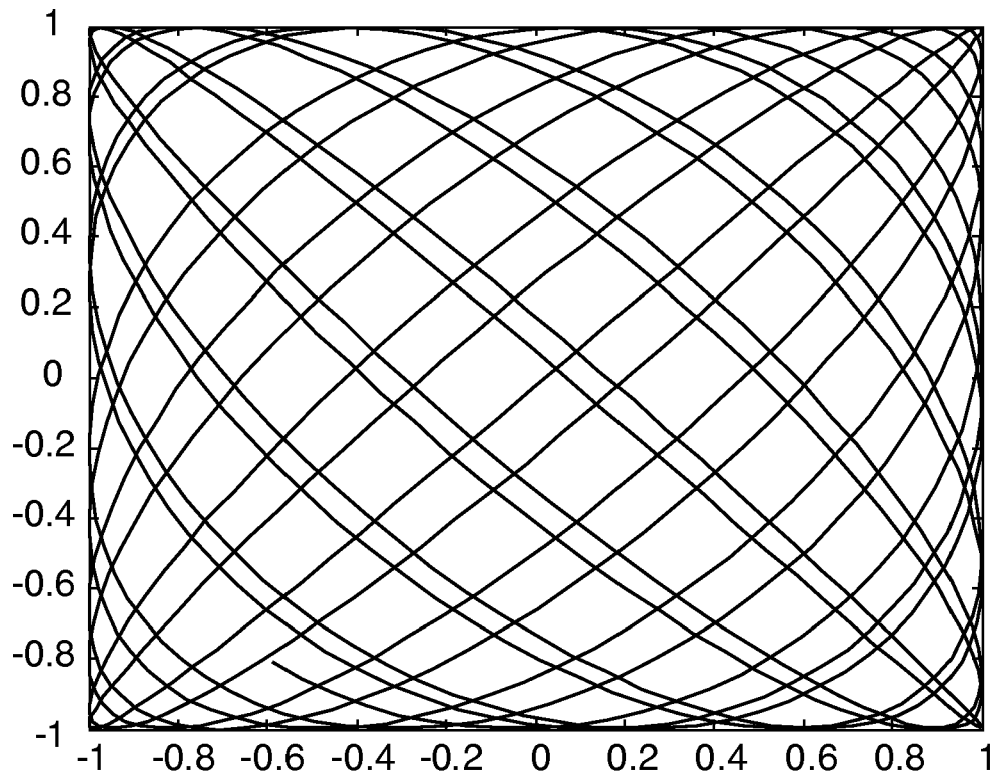
FIG. 6 shows the path of the tip of a capillary, which forms a Lissajous figure.

FIG. 1 is a plan view of an ultrasonic transducer 1 according to the invention. The axes of a Cartesian coordinate system are denoted by x and y. The ultrasonic transducer 1 consists of an elongate horn 2, a counterpiece 3, two piezoelectric drives 4, 5 and a screw 6. The counterpiece 3 is fastened to the horn 2 by means of the screw 6, the piezoelectric drives 4, 5 being clamped between the horn 2 and the counterpiece 3. The counterpiece 3 thus serves as a tensioning beam in order to mechanically pretension the piezoelectric drives 4, 5. The horn 2 is configured symmetrically with respect to its longitudinal axis 7. The horn 2 has a flange 8 which extends on either side of the longitudinal axis 7 and has holes 9 in order to fasten the ultrasonic transducer 1 to the bonding head 10, which is merely indicated in the drawing, of a wire bonder. The horn 2 additionally has, in proximity to its tip 11, a hole 12 which extends perpendicularly to the plane of the drawing and in which a capillary can be fastened. The total length of the transducer 1 is denoted by reference character L and reaches from the end of the head of the screw 6 up to the opposing tip 11 of the horn 2. The width B(y) and also the thickness D(y) and thus the distribution of the mass of the horn 2 of the transducer 1 vary in the Y direction. The front part of the horn 2 is, for example, conical in its configuration.

The ultrasonic transducer 1 serves to cause the tip of the capillary which is clamped in the horn 2 to oscillate ultrasonically. The ultrasonic transducer 1 is an oscillating system in which all of the parts, not just the horn 2, oscillate. The ultrasonic transducer 1 according to the invention is designed in such a way that the two piezoelectric drives excite the horn 2 in a first operating mode to perform ultrasonic oscillations, i.e. continuous ultrasonic waves, which are directed in the longitudinal direction of the horn 2, the tip of the capillary then also performing oscillations directed parallel to the longitudinal axis 7 of the horn 2. Ultrasonic oscillations of this type are also referred to as longitudinal oscillations or continuous longitudinal waves. Because the oscillations of the tip of the capillary extend in the Y direction, this mode will be referred to hereinafter as the Y mode. The ultrasonic transducer 1 according to the invention is furthermore designed in such a way that the two piezoelectric drives excite the horn 2 in a second operating mode to perform ultrasonic oscillations (i.e., again, continuous ultrasonic waves) which are directed transversely to the longitudinal axis of the horn 2, the tip of the capillary then also performing oscillations which are directed transversely to the longitudinal axis 7 of the horn 2. Ultrasonic oscillations of this type are also referred to as flexural oscillations. Because the oscillations of the tip of the capillary extend in this case in the X direction, this mode will be referred to hereinafter as the X mode.

In the Y mode in-phase alternating voltages are applied to the two piezoelectric drives 4, 5, so they are always extended and contracted simultaneously in the Y direction. In the X mode the two piezoelectric drives 4, 5 are excited with inversely phased alternating voltages, so the first piezoelectric drive 4 is extended in the Y direction when the second piezoelectric drive 5 is contracted in the Y direction.

There will be described hereinafter various properties which the transducer 1 either must have or preferably should have so that the amplitude of the oscillations of the tip of the capillary achieves, both in the Y mode and in the X mode of the transducer 1, dimensions which can be used for wire bonding.

FIG. 2 shows the amplitude $A_1$ of the continuous ultrasonic waves along the longitudinal axis 7 of the transducer 1 that result in the Y mode. FIG. 3 shows the amplitude $A_2$ of the continuous ultrasonic waves along the longitudinal axis 7 of the transducer 1 that result in the X mode. FIG. 4 shows the amplitude $A_3$ of the continuous ultrasonic waves of the X mode along the X axis of the flange 8. These ultrasonic waves are directed in the X direction. FIG. 5 shows the amplitude $A_4$ of the continuous ultrasonic waves of the X mode along the X axis of the counterpiece 3. At the longitudinal ends of the transducer 1, and also at the lateral ends of the counterpiece 3 and of the flange 8, there is obviously an antinode. The transducer 1 is in the example designed in such a way that the ultrasonic waves of the Y mode have on the longitudinal axis 7 of the transducer 1 $n_1$=5 nodes. The number $n_1$ of nodes can however also be a different one. Furthermore, according to the invention, the transducer 1 is designed in such a way that
A) the piezoelectric drive 4 and the piezoelectric drive 5 are located in a first node 13 (FIG. 2) of the Y mode. Preferably, the centre of the piezoelectric drives 4, 5, or a point close to the centre, is located in the first node 13.
B) the piezoelectric drive 4 and the piezoelectric drive 5 are located in a first antinode 14 (FIG. 3) of the X mode. Preferably, the centre of the piezoelectric drives 4, 5, or a point close to the centre, is located in the first antinode 14.
C) the flange 8 is located in a second node 15 (FIG. 2) of the Y mode,
D) the flange 8 is located in a second antinode 16 (FIG. 3) of the X mode, and
E) the two holes 9 in the flange 8 are located in a lateral node 17 (FIG. 4) of the X mode.

The properties A to D can be achieved by the following method:

The desired frequency $f_Y$ of the ultrasonic oscillations of the Y mode is defined. This is typically about 125 kHz.

The length L of the transducer 1 is defined in such a way that in the Y mode $n_1$ nodes occur. The length L depends substantially on the frequency $f_Y$ and the acoustic velocity of the material of which the horn 2 and the counterpiece 3 are made. The horn 2 and the counterpiece 3 are preferably made of titanium.

The width B(y) and optionally also the thickness D(y) of the horn 2 are varied locally until there is found a suitable flexural oscillation, the eigenfrequency $f_X$ of which is close to the frequency $f_Y$ (i.e. $|f_X-f_Y|\ll f_Y$) and which has an antinode in the region of the centre of the piezoelectric drives 4, 5 and an antinode in the region of a node of the Y mode. This flexural oscillation is selected as the X mode. In the example the properties B and D and the condition $|f_X-f_Y|\ll f_Y$ can be achieved in a sufficient mass.

Continuous ultrasonic waves also form in the flange 8, an antinode occurring at the ends of the flange 8. The X position and number of nodes referred to as lateral nodes depend on the length K of the flange 8. The length K is selected in such a way that at least one lateral node, namely in the example the node 17 (FIG. 4), occurs in the X mode. The property E can therefore be achieved by appropriate selection of the length K of the flange 8.

The transducer 1 is furthermore advantageously designed in such a way that
F) the hole 12 for the capillary is arranged in the—measured from the tip 11 of the horn 2—second antinode which is set in the X mode and is denoted in the present document by reference numeral 18.
G) at least one node, in the example the node 19 (FIG. 2), occurs between the head of the screw 6 and the piezoelectric drives 4, 5 in the Y mode, and
H) in the X mode in the counterpiece 3, both in the centre and close to the edge, a lateral node 20 (FIG. 5) occurs so that the entire surface, facing the counterpiece 3, of the piezoelectric drives 4, 5 oscillates in the same Y direction and is thus exposed (in accordance with the frequency $f_X$) alternately to either a tensile or a compressive load. This prevents one part of the surface from being moved in the positive Y direction, whereas at the same time another part of the surface is moved in the negative Y direction.

The property G can be achieved by appropriate selection of the length $L_G$ of the counterpiece 3 and the length $L_S$ of the piece of the screw 6 that protrudes out of the counterpiece 3. The property H can be achieved by optimising the geometric shape and thus the distribution of the mass of the counterpiece 3. In the example the counterpiece 3 is a plate, of which the ends that are more remote from the longitudinal axis 7 of the transducer 1 are for this reason widened as shown in FIG. 1. Preferably, a width $B_1$ of the counterpiece 3 is greater than the distance $D_1$ of the outer edge of the piezoelectric drive 4 or 5 from the longitudinal axis 7 of the ultrasonic transducer 1, so that the counterpiece 3 projects laterally beyond the piezoelectric drives 4 and 5.

The transducer 1 according to the invention can be operated in three modes, namely just in the Y mode, just in the X mode or in an XY mode in which both the X mode and the Y mode are excited simultaneously. The Y mode is particularly suitable for bonding wire loops which extend in the Y direction, the X mode is particularly suitable for bonding wire loops which extend in the X direction. The XY mode is a completely novel mode in which both the X mode and the Y mode are excited simultaneously and independently of each other, although in such a way that the amplitudes of the oscillations of the tip of the capillary in the X direction and in the Y direction have a reasonable size; preferably, they are approximately the same size. The oscillations of the tip of the capillary in the X direction and in the Y direction are not correlated, as a result of which the tip of the capillary forms a Lissajous figure. The tip of the capillary therefore follows a Lissajous path which is limited by a rectangle. An example of a Lissajous path is shown in FIG. 6.

Figure 7:
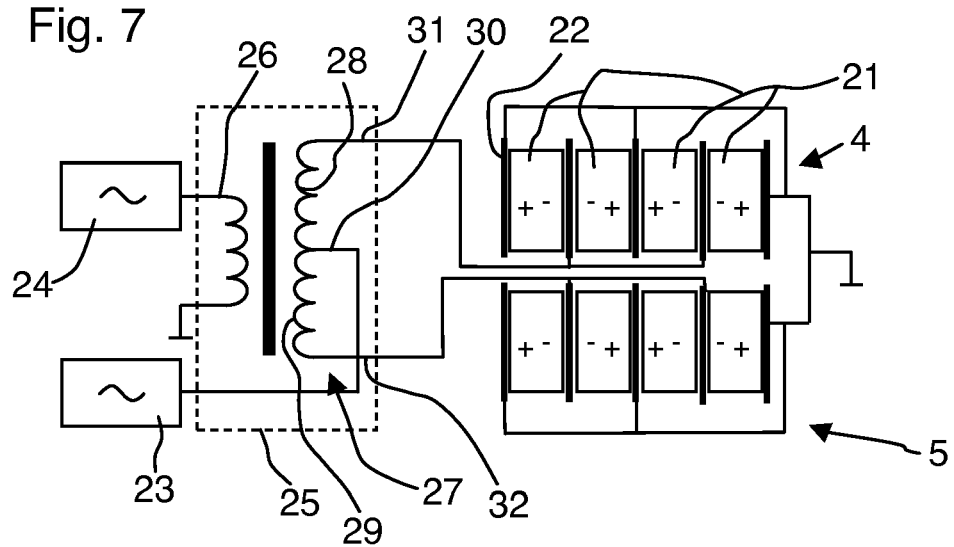
FIG. 7 shows a control unit for the ultrasonic transducer.

FIG. 7 shows a control circuit which allows the ultrasonic transducer 1 to be operated in the three above-mentioned modes. The piezoelectric drives 4, 5 are identical in their construction. Each piezoelectric drive 4, 5 is formed as a stack consisting of a plurality of, typically as shown four or six or more, piezo elements 21 which are stacked next to one another with alternating polarisation directions, an electrically conductive plate 22 always being clamped between the piezo elements 21. The polarisation direction of the piezo elements 21 is characterised by the sequence of the "+" and "−" signs. The control circuit comprises a first generator 23 for excitation of the Y mode, a second generator 24 for excitation of the X mode and a transformer 25 comprising a primary winding 26 and a secondary winding 27. The secondary winding 27 consists of two identical windings 28 and 29 which have a common input terminal 30 and a respective output terminal 31 or 32. The output of the first generator 23 is connected to the common input terminal 30 of the secondary winding 27. The output of the second generator 24 is connected to a first terminal of the primary winding 26, whereas a second terminal of the primary winding 26 is electrically grounded. The output terminal 31 of the winding 28 is connected to the negative terminals of the piezo elements 21 of the first piezoelectric drive 4. The output terminal 32 of the winding 29 is connected to the negative terminals of the piezo elements 21 of the second piezoelectric drive 5. The positive terminals of the piezo elements 21 of the two piezoelectric drives 4 and 5 are electrically grounded.

The first generator 23 supplies an alternating voltage $U_1 = U_Y \cos(2\pi f_Y t + \phi_Y)$, wherein t denotes time and $\phi_Y$ denotes the phase position. The second generator 24 supplies an alternating voltage $U_2 = U_X \cos(2\pi f_X t + \phi X)$, wherein $\phi_X$ denotes the phase position. The following table indicates which alternating voltage is applied in the three aforementioned modes to the piezoelectric drives 4 and 5:

|  | Piezoelectric drive 4 | Piezoelectric drive 5 |
| --- | --- | --- |
| Y mode | $U_1$ | $U_1$ |
| X mode | $U_2$ | $-U_2$ |
| XY mode | $U_1 + U_2$ | $U_1 - U_2$ |

What is claimed is:

1. An ultrasonic transducer, comprising
an elongate horn,
a counterpiece,
two piezoelectric drives, and
a screw, the counterpiece being fastened to the horn by means of the screw, the piezoelectric drives arranged on either side of a longitudinal axis of the transducer and clamped between the horn and the counterpiece, the horn having a flange comprising at least one hole for fastening the transducer to a bonding head of a wire bonder, wherein
first ultrasonic oscillations, which are directed parallel to the longitudinal axis of the transducer, form in the transducer when first, in-phase alternating voltages are applied to the two piezoelectric drives,
second ultrasonic oscillations, which are directed transversely to the longitudinal axis of the transducer, form in the transducer when second, inversely phased alternating voltages are applied to the two piezoelectric drives,
and wherein
the piezoelectric drives are located in a first node of the first ultrasonic oscillations,
the piezoelectric drives are located in a first antinode of the second ultrasonic oscillations,
the flange is located in a second node of the first ultrasonic oscillations,
the flange is located in a second antinode of the second ultrasonic oscillations, and
the at least one hole in the flange is located in a further node of the second ultrasonic oscillations.

2. An ultrasonic transducer according to claim 1, wherein the horn has a hole for receiving the capillary and wherein this hole is formed in an antinode of the second ultrasonic oscillations which is—measured from the tip of the horn—the second antinode.

3. An ultrasonic transducer according to claim 1, wherein the second ultrasonic oscillations have at least one node which is located between the head of the screw and the piezoelectric drives.

4. An ultrasonic transducer according to claim 1, wherein the second ultrasonic oscillations have in the counterpiece a node which is located close to the edge of the counterpiece.

5. An ultrasonic transducer according to claim 1, wherein a width of the counterpiece is greater than a distance of an outer edge of the piezoelectric drives from the longitudinal axis of the transducer.

6. An ultrasonic transducer according to claim 2, wherein the second ultrasonic oscillations have at least one node which is located between the head of the screw and the piezoelectric drives.

7. An ultrasonic transducer according to claim 2, wherein the second ultrasonic oscillations have in the counterpiece a node which is located close to the edge of the counterpiece.

8. An ultrasonic transducer according to claim 3, wherein the second ultrasonic oscillations have in the counterpiece a node which is located close to the edge of the counterpiece.

9. An ultrasonic transducer according to claim 6, wherein the second ultrasonic oscillations have in the counterpiece a node which is located close to the edge of the counterpiece.

10. An ultrasonic transducer according to claim 2, wherein a width of the counterpiece is greater than a distance of an outer edge of the piezoelectric drives from the longitudinal axis of the transducer.

11. An ultrasonic transducer according to claim 3, wherein a width of the counterpiece is greater than a distance of an outer edge of the piezoelectric drives from the longitudinal axis of the transducer.

12. An ultrasonic transducer according to claim 4, wherein a width of the counterpiece is greater than a distance of an outer edge of the piezoelectric drives from the longitudinal axis of the transducer.

13. An ultrasonic transducer according to claim 6, wherein a width of the counterpiece is greater than a distance of an outer edge of the piezoelectric drives from the longitudinal axis of the transducer.

14. An ultrasonic transducer according to claim 7, wherein a width of the counterpiece is greater than a distance of an outer edge of the piezoelectric drives from the longitudinal axis of the transducer.

15. An ultrasonic transducer according to claim 8, wherein a width of the counterpiece is greater than a distance of an outer edge of the piezoelectric drives from the longitudinal axis of the transducer.

16. An ultrasonic transducer according to claim 9, wherein a width of the counterpiece is greater than a distance of an outer edge of the piezoelectric drives from the longitudinal axis of the transducer.

* * * * *